United States Patent
Abdali Mashhadi

(10) Patent No.: US 12,218,653 B2
(45) Date of Patent: Feb. 4, 2025

(54) CONTROL DRIVER CIRCUIT AND METHOD FOR POWER TRANSISTOR

(71) Applicant: Infineon Technologies Canada Inc., Ottawa (CA)

(72) Inventor: Iman Abdali Mashhadi, Kanata (CA)

(73) Assignee: Infineon Technologies Canada Inc., Ottawa (CA)

(*) Notice: Subject to any disclaimer, the term of this patent is extended or adjusted under 35 U.S.C. 154(b) by 0 days.

(21) Appl. No.: 18/194,240

(22) Filed: Mar. 31, 2023

(65) Prior Publication Data
US 2024/0333275 A1    Oct. 3, 2024

(51) Int. Cl.
*H03K 17/0412*    (2006.01)
*H03K 17/16*    (2006.01)

(52) U.S. Cl.
CPC ..... *H03K 17/04123* (2013.01); *H03K 17/162* (2013.01); *H03K 2217/0081* (2013.01)

(58) Field of Classification Search
CPC ........... H03K 17/04123; H03K 17/162; H03K 2217/0081
USPC ................................................ 327/108, 109
See application file for complete search history.

(56) References Cited

U.S. PATENT DOCUMENTS

| | | | |
|---|---|---|---|
| 4,864,247 A * | 9/1989 | Baur ................ | H03K 17/04126 327/579 |
| 6,650,169 B2 | 11/2003 | Faye et al. | |
| 2016/0359481 A1 | 12/2016 | Leong et al. | |

FOREIGN PATENT DOCUMENTS

JP        2018121507        8/2018

OTHER PUBLICATIONS

International Search Report and Written Opinion of the International Searching Authority for application No. PCT /IB2024/053063 mailed on Jun. 26, 2024.

* cited by examiner

*Primary Examiner* — William Hernandez
(74) *Attorney, Agent, or Firm* — WORKMAN NYDEGGER

(57) ABSTRACT

A control driver circuit that includes a switching transistor coupled between a first voltage supply node and an output node of the gate, the output node coupled or couplable to a control node of the power transistor. A circuit includes an inductive element coupled between the control transistor and a second voltage supply node. The circuit is configured such that if the output node is coupled to the power transistor, and in response to the switching transistor being turned on, a current is induced within the inductive element and a voltage from the first voltage supply is provided to a control node of the power transistor to thereby turn on the power transistor. On the other hand, in response to the switching transistor being turned off, the induced current is drawn from the output node to thereby turn the power transistor off.

14 Claims, 4 Drawing Sheets

CONTROL DRIVER CIRCUIT AND METHOD FOR POWER TRANSISTOR

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, negligible or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current-hence the term "field-effect transistor".

Normal transistors are used for amplifying and switching purposes. On the other hand, power transistors are used to convey more substantial current and have higher voltage ratings. Power transistors can typically operate with currents greater than 1 Amp to as much as a hundred amps or even greater. Power transistors may convey power greater than 1 Watt to as many as hundreds of watts or even greater. There are many conventional uses of power transistors including supplying power in power supplies, charging of batteries, and high current driving of laser diodes. For instance, power transistors can be used in Light Detecting and Ranging (also called "Lidar").

Light Detection and Ranging (Lidar) is a remote sensing technology that uses lasers to measure distances to objects within the environment. Such might be used, for instance, to generate a three-dimensional map of the surrounding environment. The technology works by emitting a laser beam and measuring the time it takes for the beam to reflect off an object and return to a sensor. Lidar systems typically consist of a laser, a scanner that directs the laser beam in different directions, a receiver that detects the reflected laser light, and a computer that processes the data to create the three-dimensional map of the environment. Lidar can be used to generate highly accurate and detailed maps of terrain, buildings, vegetation, and other objects.

Lidar has numerous applications, including in the fields of geology, archaeology, forestry, oceanography, robotics and urban planning. It is also used in vehicles, where it can help the vehicle detect and avoid obstacles. Lidar may even be used in autonomous vehicles to help the vehicle navigate with knowledge of the surrounding environment. When used in vehicles, the environment surrounding the vehicle may frequently change. Thus, the Lidar may involve repeatedly performing the cycle of beam emission, reflection detection, and distance calculation quickly in order to formulate a dynamic model of the changing environment surrounding the vehicle.

The subject matter claimed herein is not limited to embodiments that solve any disadvantages or that operate only in environments such as those described above. Rather, this background is only provided to illustrate one example technology area where some embodiments described herein may be practiced.

SUMMARY OF THE INVENTION

In some aspects, the techniques described herein relate to a control driver circuit for controlling an on-off state of a power transistor in a way as to more quickly turn the power transistor off than on. The control driver circuit includes a switching transistor coupled between a first voltage supply node and an output node of the gate driver circuit, the output node coupled or couplable to a control node of the power transistor. The control driver circuit also includes an inductive element coupled between the control transistor and a second voltage supply node. The control driver circuit is configured such that in response to the switching transistor being turned on, a current is induced within the inductive element and a voltage from the first voltage supply is provided to a control node of the power transistor to thereby turn on the power transistor on if the control node of the power transistor is coupled to the output node. Furthermore, the control driver circuit is configured such that in response to the switching transistor being turned off, the induced current is drawn from the output node to thereby turn the power transistor off if the control node of the power transistor is coupled to the output node.

In some aspects, the techniques described herein relate to a method for driving an on-off state of a power transistor so as to more quickly turn the power transistor off than on. The method includes turning on a switching transistor coupled between a first voltage supply node and an output node of the gate driver circuit, the output node being coupled to a control node of the power transistor. The turning on causes a current to be induced within an inductive element that is coupled between the control transistor and a second voltage supply node. The turning on also causes a voltage from the first voltage supply to be provided to the control node of the power transistor to thereby turn on the power transistor. The method also includes turning off the switching transistor. This turning off causes the induced current to be drawn from the output node to thereby turn the power transistor off.

The principles described herein are not limited to why the power transistor is turned off quickly. However, in one embodiment, the turning of the power transistor off allows current to flow to a laser diode. Accordingly, quickly turning off the power transistor allows a rapid increase in current to pass through the laser diode, thus turning the laser diode on quickly. Such might be beneficial to help the laser diode emit light with a pulse that rises quickly. In conjunction with a mechanism to quickly use the current, the laser diode may thereafter be quickly turned off. Such allows for a precise and high intensity light pulse to be generated by the laser diode. This may be particularly advantageous in the context of a laser diode used for Light Detection and Ranging (Lidar) applications, since short and high power light pulses assist in detecting the environment more frequently and over longer distances.

The principles described herein allow the turning off of the power transistor to occur with less dependence on parasitic common source inductance of the power transistor. The parasitic common source inductance of a power transistor can vary widely by a number of factors including how the power transistor is packaged. Accordingly, the principles described herein allow for the power transistor to be quickly turned off with reliability regardless of packaging or any other effect that can vary the parasitic common source inductance of the power transistor.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the advantages and features of the systems and methods described herein can be obtained, a more particular description of the embodiments briefly described above will be rendered by reference to specific embodiments thereof which are illustrated in the appended drawings. Understanding that these drawings depict only typical embodiments of the systems and methods described herein, and are not therefore to be considered to be limiting of their scope, certain systems and methods will be described and explained with additional specificity and detail through the use of the accompanying drawings in which.

DETAILED DESCRIPTION OF THE INVENTION

At least some embodiments described herein relate to a control driver circuit for controlling an on-off state of a power transistor in a way as to more quickly turn the power transistor off than on. The control driver circuit includes a switching transistor coupled between a first voltage supply node and an output node of the control driver circuit, the output node coupled or couplable to a control node of the power transistor. The control driver circuit also includes an inductive element coupled between the control transistor and a second voltage supply node. The control driver circuit is configured such that in response to the switching transistor being turned on, a current is induced within the inductive element and a voltage from the first voltage supply is provided to a control node of the power transistor to thereby turn on the power transistor if the control node of the power transistor is coupled to the output node. Furthermore, the control driver circuit is configured such that in response to the switching transistor being turned off, the induced current is drawn from the output node to thereby turn the power transistor off if the control node of the power transistor is coupled to the output node.

The principles described herein are not limited to why the power transistor is turned off quickly. However, in one embodiment, the turning of the power transistor off allows current to flow to a laser diode. Accordingly, quickly turning off the power transistor allows a rapid increase in current to pass through the laser diode, thus turning the laser diode on quickly. Such might be beneficial to help the laser diode emit light with a pulse that rises quickly. In conjunction with a mechanism to quickly use the current, the laser diode may thereafter be quickly turned off. Such allows for a precise and high intensity light pulse to be generated by the laser diode. This may be particularly advantageous in the context of a laser diode used for Light Detection and Ranging (Lidar) applications, since short and high power light pulses assist in detecting the environment more frequently and over longer distances.

The principles described herein allow the turning off of the power transistor to occur with less dependence on parasitic common source inductance of the power transistor. The parasitic common source inductance of a power transistor can vary widely by a number of factors including how the power transistor is packaged. Accordingly, the principles described herein allow for the power transistor to be quickly turned off with reliability regardless of packaging or any other effect that can vary the parasitic common source inductance of the power transistor.

Figure 1:
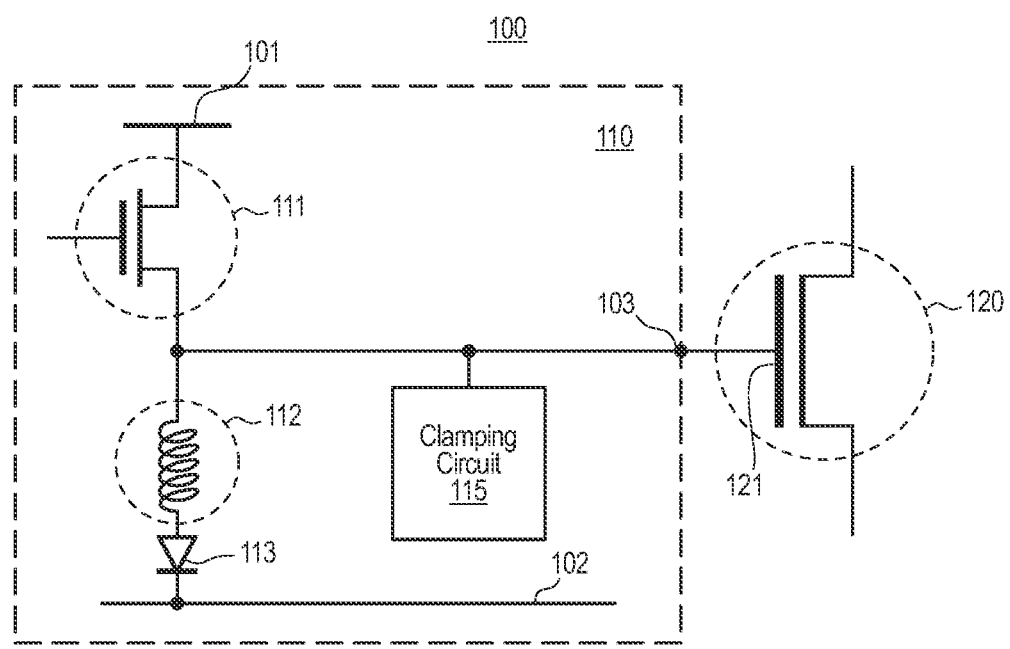
FIG. 1 illustrates an environment in which a control driver circuit controls an on-off state of a power transistor, in accordance with the principles described herein.

FIG. 1 illustrates an environment 100 in which a control driver circuit 110 controls an on-off state of a power transistor 120. As will be explained, the control driver circuit 110 is configured to quickly turn off the power transistor 120. The principles described herein are not limited to the power transistor being of any particular type. As an example, the power transistor may be formed of a heterojunction formed from two layers of semiconductor materials having unequal bandgaps. One example of such a transistor is a high electron mobility transistor (HEMT). As another example, the power transistor may be a silicon carbide power transistor, a gallium arsenide power transistor, a gallium nitride power transistor, or an indium gallium arsenide power transistor. However, again, the principles described herein are not limited to the power transistor 120 being any particular type of power transistor. A "power transistor" is any transistor that can convey power greater than 10 Watts. Some power transistors can convey power far into the kilowatts range.

The control driver circuit 110 includes a switching transistor 111 coupled between a first voltage supply node 101 and an output node 103 of the control driver circuit. Although the switching transistor 111 is illustrated as a field-effect transistor, the principles described herein are not limited to the switching transistor 111 being any particular type of transistor. As an example, the switching transistor 111 may be a field-effect transistor. As a more specific example, the switching transistor 111 may be a metal-oxide-semiconductor field-effect transistor (a "MOSFET").

The output node 103 of the control driver circuit 110 is coupled (or at least can be coupled) to a control node 121 of the power transistor 120. In FIG. 1, the power transistor 120 is illustrated as a field-effect transistor, though the principles described herein are not limited to the power transistor 120 being a field-effect transistor. The control driver circuit 110 is a circuit that drives the control node of the power transistor 120 and thus is called herein a "control driver" circuit. If, for example, the power transistor 120 is a field-effect transistor, then that control node 121 would be a gate terminal of the power transistor 120. In that case, the control driver circuit 110 may be considered to be a "gate driver" circuit or a "gate drive" circuit.

The control driver circuit 110 also includes an inductive element 112 and a diode 113 coupled in series between the output node 103 and a second voltage supply node 102. Thus, the switching transistor 111, the inductive element 112 and the diode 113 are connected in series between the first voltage supply node 101 and the second voltage supply node 102. The diode 113 has a forward direction from the output node 103 towards the second voltage supply node 102. The inductive element 112 is illustrated as being an inductor coupled between the output node 103 and the second voltage supply node 102. However, the inductive element 112 may be any circuit or element that has inductivity. One example of the inductive element 112 is an inductor coupled between the output node 103 and the second voltage supply node 102.

Figure 2:
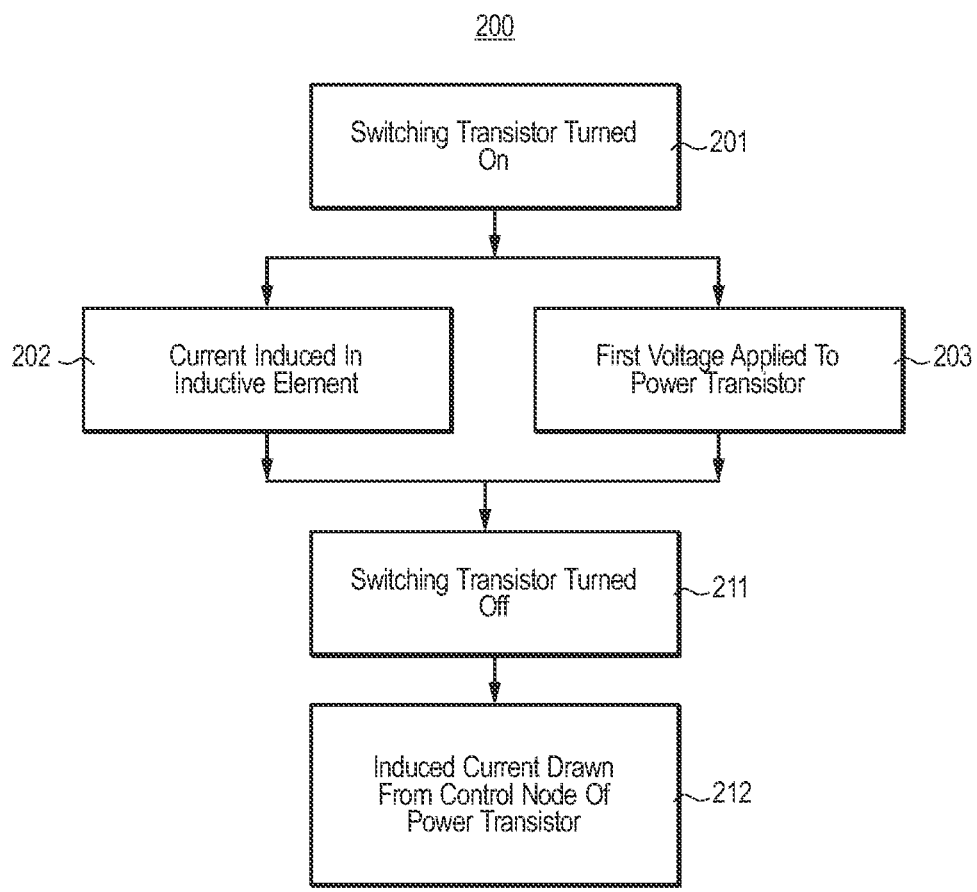
FIG. 2 illustrates a flowchart of a method for driving a control node of a power transistor, in accordance with the principles described herein.

The control driver circuit 110 is configured to operate when the output node 103 is coupled to the control node 121 of the power transistor 120. FIG. 2 illustrates a flowchart of a method 200 for driving a control node of a power transistor in accordance with the principles described herein. The method 200 is specifically a method for driving an on-off state of a power transistor so as to quickly turn the power transistor off. As an example, the method 200 drives the on-off state of a power transistor so as to more quickly turn the power transistor 120 off than on. The method 200 may be performed by the control driver circuit 110 of FIG. 1. Accordingly, the method 200 will now be described with frequent reference to the environment 100 of FIG. 1.

The method 200 may be performed when the output node 103 of the control driver circuit 110 is coupled to the control node 121 of the power transistor 120. In accordance with the method 200, in response to the switching transistor being turned on (act 201), a current is induced within the inductive element (act 202) and a voltage (also called herein a "first voltage") from a first voltage supply is provided to a control node of the power transistor (act 203) to thereby turn on the power transistor. For instance, with reference to FIG. 1, in response to the switching transistor 111 being turned on, a current is induced within the inductive element 112 and a first voltage from the first voltage supply node 101 is provided to control node 121 of the power transistor 120 to thereby turn on the power transistor 120.

Thereafter, in response to the switching transistor being turned off (act 211), the induced current (that built up while the switching transistor was on) is drawn from the output node of the power transistor (act 212) to thereby turn the power transistor off. For example, with reference to FIG. 1, in response to the switching transistor 111 being turned off, the induced current (that built up while the switching transistor 111 was on) is drawn from the output node 103 to thereby turn the power transistor 120 off. The method 200 may be repeated for each of multiple cycles of turning the power transistor 120 on and thereafter off.

The voltage across an inductive element is proportional to the rate of change of current through the inductive element. In the case of the inductive element 112 of FIG. 1, the rate of change in current may be positive or negative. Thus, the voltage across the inductive element 112 may be positive or negative. Accordingly, when the switching transistor 111 is off, the output voltage at the output node 103 may vary too far positive or negative to the extent that the power transistor 120 itself might be damaged or degraded. To prevent this, the control driver circuit 110 may also include a clamping circuit 115.

The clamping circuit 115 may for example be configured to protect the output node 103 from varying too far (e.g., a threshold amount) below a second voltage provided by the second voltage supply node 102. This would prevent the power transistor 120 from becoming damaged due to the output voltage at the output node 103 being too low. This may be accomplished by a Zener diode that is coupled between the output node 103 and the second voltage supply node 102 so as to have a forward direction from the output node 103 to the second voltage supply node 102. When the output voltage at the output node 103 drops a Zener diode reverse-breakdown voltage below the output voltage, current flows from the second voltage supply node 102 through the Zener diode in reverse and into the output node 103. This current prevents the voltage at the output node 103 from dropping too far below the second voltage provided by the second voltage supply node 102.

Alternatively, the clamping circuit 115 may for example be configured to protect the output node 103 from varying too far (e.g., a threshold amount) above the second voltage provided by the second voltage supply node 102. This would prevent the power transistor 120 from becoming damages due to the output voltage at the output node 103 being too high. This may be accomplished by a Zener diode that is coupled between the output node 103 and the second voltage supply node 102 so as to have a forward direction from the second voltage supply node 102 to the output node 103. When the output voltage at the output node 103 rises a Zener diode reverse-breakdown voltage above the output voltage, current flows from the output node 103 to the second voltage supply node 102 through the Zener diode in reverse. This current prevents the voltage at the output node from rising too far above the second voltage provided by the second voltage supply node 102.

Figure 3:
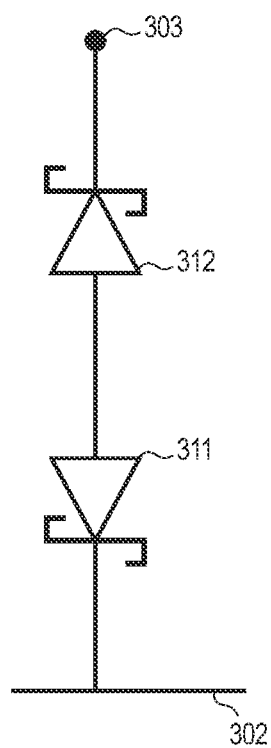
FIG. 3 illustrates a clamping circuit that may prevent the output voltage at the output node of the control driver circuit from rising too high or dropping too low.

Alternatively, the clamping circuit 115 may for example be configured to protect the output node 103 from varying too far (e.g., by a second threshold) above the second voltage provided by the second voltage supply node 102, and from varying too far (e.g., by a first threshold) below the second voltage provided by the second voltage supply node 102. FIG. 3 illustrates a clamping circuit 300 that may accomplish this, and is an example of the clamping circuit 115 of FIG. 1.

The clamping circuit 300 includes two Zener diodes 311 and 312 that are coupled between an output node 303 and a second voltage supply node 302. The output node 303 may be, for example, the output node 103 of FIG. 1. The second voltage supply node 302 may be, for example, the second voltage supply node 102 of FIG. 1. The first Zener diode 311 has a forward direction from the output node 303 to the second voltage supply node 302, such that when the output voltage on the output node 303 drops below the first threshold below a second voltage provided by the second voltage supply node 302, the first Zener diode 311 is reverse-biased in reverse-biased breakdown. In this case, the second Zener diode 312 is forward-biased, also allowing such current to freely flow. On the other hand, the second Zener diode 312 has a forward direction from the second voltage supply node 302 to output node 303, such that when the output voltage on the output node 303 rises above the second threshold above a second voltage provided by the second voltage supply node 302, the second Zener diode 312 is reverse-biased in reverse-biased breakdown. In this case, the first Zener diode 311 is forward-biased, also allowing such current to freely flow.

In the case of the power transistor being a field-effect transistor, the principles described herein may be applied to quickly turn off a power transistor regardless of whether the power transistor is an enhancement-mode transistor or a depletion-mode transistor.

Figure 4:
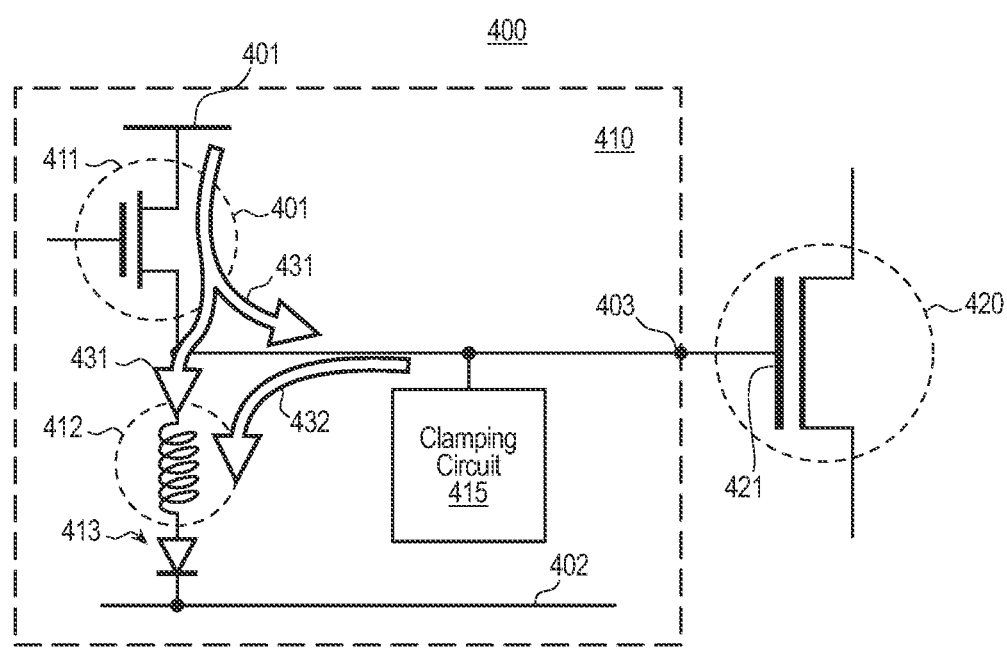
FIG. 4 illustrates an environment that is similar to the environment of FIG. 1, but in the various currents are also shown involved with both turning the power transistor on and turning the power transistor off.

FIG. 4 illustrates an environment 400 that is similar to the environment 100 of FIG. 1 with some differences. First, the power transistor 420 is a field-effect transistor. Second, one arrow shows current flow 431 that occurs while the switching transistor 411 is on, and another arrow shows current flow 432 that occurs while the switching transistor 411 is off. Third, the first voltage supply node 401 is a high voltage supply that provides a first voltage (a "higher voltage") that is higher than a second voltage (a "lower voltage") supplied by the second voltage supply node 402, which is a low voltage supply. The first voltage supply node 401, the second voltage supply node 402, the output node 403, the control driver circuit 410, the switching transistor 411, the inductive element 412, the diode 413, the clamping circuit 415, the power transistor 420 and the control node 421 of FIG. 4 may otherwise operate and be structured as described for the first voltage supply node 101, the second voltage supply node 102, the output node 103, the control driver circuit 110, the switching transistor 111, the inductive element 112, the diode 113, the clamping circuit 115, the power transistor 120 and the control node 121, respectively, of FIG. 1.

In the case of FIG. 4, when the switching transistor 411 is turned on, current flows from the first voltage supply node 401 through the switching transistor 411, and onto the control node 421 of the power transistor 420. Furthermore, while the switching transistor 411 is on, current (from the first voltage supply node 401 through the switching transistor 411) builds up through the inductive element 412. On the other hand, when the switching transistor 411 is turned off, the induced current is drawn from the output node 403 to thereby turn the power transistor off. Thus, the configuration of FIG. 1 operates to quickly discharge a gate terminal of a field-effect transistor to quickly turn the field-effect transistor off.

As previously mentioned, the principles described herein are not limited to why the power transistor is turned off quickly. However, in one embodiment, the turning of the power transistor off allows current to flow to a laser diode. Accordingly, quickly turning off the power transistor allows a rapid increase in current to pass through the laser diode, thus turning the laser diode on quickly. Such might be beneficial to help the laser diode emit light with a pulse that rises quickly. In conjunction with a mechanism to quickly use the current, the laser diode may thereafter be quickly turned off. Such allows for a precise and high intensity light pulse to be generated by the laser diode. This may be particularly advantageous in the context of a laser diode used for Light Detection and Ranging (Lidar) applications, since short and high power light pulses assist in detecting the environment more frequently and over longer distances.

Literal Support Section for European Practice

Clause 1. A control driver circuit for controlling an on-off state of a power transistor, the driver circuit configured to more quickly turn the power transistor off than on, the control driver circuit comprising: a switching transistor coupled between a first voltage supply node and an output node of the control driver circuit, the output node coupled or couplable to a control node of the power transistor; and an inductive element coupled between the control transistor and a second voltage supply node, wherein the control driver circuit is configured such that if the output node control node is coupled to the power transistor: in response to the switching transistor being turned on, a current is induced within the inductive element and a voltage from the first voltage supply is provided to a control node of the power transistor to thereby turn on the power transistor if the output node is coupled to the control node of the power transistor; and in response to the switching transistor being turned off, the induced current is drawn from the output node to thereby turn the power transistor off if the output node is coupled to the control node of the power transistor.

Clause 2. The control driver circuit in accordance with claim 1, the first voltage supply supplying a first voltage that is higher than a second voltage provided by the second voltage supply, the control driver circuit further comprising a diode connected in series with the inductive element between the output node and the second voltage supply, the diode having a forward direction from the output node towards the second voltage supply.

Clause 3. The control driver circuit in accordance with claim 1, further comprising a clamping circuit coupled to the output node, and configured to prevent an output voltage present on the output node from dropping below a threshold that is below the second voltage.

Clause 4. The control driver circuit in accordance with claim 3, the clamping circuit comprising a Zener diode that is coupled between the output node and the second voltage supply so as to have a forward direction from the output node and the second voltage supply, wherein when the output voltage drops below the threshold, the Zener diode is reverse-biased in reverse-biased breakdown.

Clause 5. The control driver circuit in accordance with claim 3, the threshold being a first threshold, the clamping circuit also configured to prevent the output voltage present on the output node from rising above a second threshold that is above the second voltage.

Clause 6. The control driver circuit in accordance with claim 5, the clamping circuit comprising a first Zener diode and a second Zener diode that are coupled in series between the output node and the second voltage supply, the first Zener diode having a forward direction from the output node to the second voltage supply, such that when the output voltage drops below the first threshold, the first Zener diode is reverse-biased in reverse-biased breakdown, and the second Zener diode having a forward direction from the second voltage supply to the output node, such that when the output voltage drops rises above the second threshold, the first second diode is reverse-biased in reverse-biased breakdown.

Clause 7. The control driver circuit in accordance with claim 1, further comprising a clamping circuit coupled to the output node, and configured to prevent an output voltage present on the output node from rising above a threshold that is above the second voltage.

Clause 8. The control driver circuit in accordance with claim 1, the inductive element comprising an inductor coupled between the control transistor and the second voltage supply node.

Clause 9. The control driver circuit in accordance with claim 1, the switching transistor being a metal-oxide-silicon field-effect transistor MOSFET, the power transistor being formed from a heterojunction.

Clause 10. The control driver circuit in accordance with claim 1, further comprising: the power transistor, the power transistor being formed of a heterojunction formed from two layers of semiconductor materials having unequal bandgaps.

Clause 11. The control driver circuit in accordance with claim 10, the power transistor being a silicon carbide power transistor.

Clause 12. The control driver circuit in accordance with claim 10, the power transistor being a gallium arsenide power transistor.

Clause 13. The control driver circuit in accordance with claim 10, the power transistor being a gallium nitride power transistor.

Clause 14. The control driver circuit in accordance with claim 10, the power transistor being an indium gallium arsenide power transistor.

Clause 15. A method for driving an on-off state of a power transistor so as to more quickly turn the power transistor off than on, the method comprising: turning on a switching transistor coupled between a first voltage supply node and an output node, the output node being coupled to a control node of the power transistor, the turning on causing a current to be induced within an inductive element that is coupled between the control transistor and a second voltage supply node, the turning on also causing a voltage from the first voltage supply to be provided to the control node of the power transistor to thereby turn on the power transistor; and turning off the switching transistor, the turning off causing the induced current to be drawn from the output node to thereby turn the power transistor off.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A control driver circuit for controlling an on-off state of a power transistor, the driver circuit configured to more quickly turn the power transistor off than on, the control driver circuit comprising:
   a switching transistor coupled between a first voltage supply node and an output node of the control driver circuit, the output node coupled or couplable to a control node of the power transistor; and
   an inductive element coupled between the switching transistor and a second voltage supply node,
   wherein the control driver circuit is configured such that if the output node control node is coupled to the power transistor:
   in response to the switching transistor being turned on, a current is induced within the inductive element and a voltage from the first voltage supply is provided to the control node of the power transistor to thereby turn on the power transistor if the output node is coupled to the control node of the power transistor; and
   in response to the switching transistor being turned off, the induced current is drawn from the output node to thereby turn the power transistor off if the output node is coupled to the control node of the power transistor, the control driver circuit further comprising a clamping circuit coupled to the output node, and configured to prevent an output voltage present on the output node from dropping below a threshold that is below a second voltage provided by the second voltage supply.

2. The control driver circuit in accordance with claim 1, the first voltage supply supplying a first voltage that is higher than the second voltage provided by the second voltage supply, the control driver circuit further comprising a diode connected in series with the inductive element between the output node and the second voltage supply, the diode having a forward direction from the output node towards the second voltage supply.

3. The control driver circuit in accordance with claim 1, the clamping circuit comprising a Zener diode that is coupled between the output node and the second voltage supply so as to have a forward direction from the output node and the second voltage supply, wherein when the output voltage drops below the threshold, the Zener diode is reverse-biased in reverse-biased breakdown.

4. The control driver circuit in accordance with claim 1, the threshold being a first threshold, the clamping circuit also configured to prevent the output voltage present on the output node from rising above a second threshold that is above the second voltage.

5. The control driver circuit in accordance with claim 4, the clamping circuit comprising a first Zener diode and a second Zener diode that are coupled in series between the output node and the second voltage supply,
   the first Zener diode having a forward direction from the output node to the second voltage supply, such that when the output voltage drops below the first threshold, the first Zener diode is reverse-biased in reverse-biased breakdown, and
   the second Zener diode having a forward direction from the second voltage supply to the output node, such that when the output voltage drops-rises above the second threshold, the first second diode is reverse-biased in reverse-biased breakdown.

6. The control driver circuit in accordance with claim 1, the inductive element comprising an inductor coupled between the control transistor and the second voltage supply node.

7. The control driver circuit in accordance with claim 1, the switching transistor being a metal-oxide-silicon field-effect transistor MOSFET, the power transistor being formed from a heterojunction.

8. The control driver circuit in accordance with claim 1, further comprising:
   the power transistor being formed of a heterojunction formed from two layers of semiconductor materials having unequal bandgaps.

9. The control driver circuit in accordance with claim 8, the power transistor being a silicon carbide power transistor.

10. The control driver circuit in accordance with claim 8, the power transistor being a gallium arsenide power transistor.

11. The control driver circuit in accordance with claim 8, the power transistor being a gallium nitride power transistor.

12. The control driver circuit in accordance with claim 8, the power transistor being an indium gallium arsenide power transistor.

13. A control driver circuit for controlling an on-off state of a power transistor, the driver circuit configured to more quickly turn the power transistor off than on, the control driver circuit comprising:
   a switching transistor coupled between a first voltage supply node and an output node of the control driver circuit, the output node coupled or couplable to a control node of the power transistor; and
   an inductive element coupled between the switching transistor and a second voltage supply node,
   wherein the control driver circuit is configured such that if the output node control node is coupled to the power transistor:
   in response to the switching transistor being turned on, a current is induced within the inductive element and a voltage from the first voltage supply is provided to the control node of the power transistor to thereby turn on the power transistor if the output node is coupled to the control node of the power transistor; and
   in response to the switching transistor being turned off, the induced current is drawn from the output node to thereby turn the power transistor off if the output node is coupled to the control node of the power transistor, the control driver circuit further comprising a clamping circuit coupled to the output node, and configured to prevent an output voltage present on the output node from rising above a threshold that is above a second voltage provided by the second voltage supply node.

14. A method for driving an on-off state of a power transistor so as to more quickly turn the power transistor off than on, the method comprising:

turning on a switching transistor coupled between a first voltage supply node and an output node, the output node being coupled to a control node of the power transistor, the turning on causing a current to be induced within an inductive element that is coupled between the switching transistor and a second voltage supply node, the turning on also causing a voltage from the first voltage supply to be provided to the control node of the power transistor to thereby turn on the power transistor;

turning off the switching transistor, the turning off causing the induced current to be drawn from the output node to thereby turn the power transistor off; and clamping a control voltage present on the control node to prevent the control voltage from dropping below a threshold that is below a second voltage provided by the second voltage supply node.

\* \* \* \* \*